United States Patent [19]

Imazeki et al.

[11] 4,327,422
[45] Apr. 27, 1982

[54] POWER SOURCE DEVICE FOR BUBBLE MEMORY UNIT

[75] Inventors: Ryoji Imazeki; Masayuki Hattori, both of Hachioji, Japan

[73] Assignee: Fujitsu Fanuc Limited, Japan

[21] Appl. No.: 169,791

[22] Filed: Jul. 17, 1980

[30] Foreign Application Priority Data

Jul. 19, 1979 [JP] Japan .................... 54-091998

[51] Int. Cl.$^3$ ................ G11C 19/08; H04B 17/00
[52] U.S. Cl. .................................. 365/1; 365/229
[58] Field of Search .............. 365/1, 226, 227, 228, 365/229, 194

[56] References Cited

U.S. PATENT DOCUMENTS 3,980,935  9/1976  Worst ............................ 365/229

OTHER PUBLICATIONS

IBM Technical Disclosure Bulletin-vol. 18, No. 12, May 1976, pp. 4147-4149.

Primary Examiner—James W. Moffitt
Attorney, Agent, or Firm—Staas & Halsey

[57] ABSTRACT

A power source device for a bubble memory unit, wherein there is supplied a first DC voltage $E_c$ which is applied to control circuitry for controlling the reading and writing of data, a second DC voltage signal $E_d$ which is applied to drive circuitry for driving a bubble memory element, and a memory signal $M_e$ which enables data to be written in or read from the bubble memory element, the signals $E_c$, $E_d$ and $M_e$ being made to rise and fall according to a prescribed sequence as a commercial power supply is connected and disconnected. The power source device includes first and second DC power source circuits, a comparator circuit for comparing the magnitude of the first DC voltage $E_c$ with a reference level $V_M$ having a value greater than an allowable lower limit value, and a delay circuit. The second DC power source circuit is actuated following a prescribed time delay which begins when the value of signal $E_c$ surpasses the reference level $V_M$ at the time that the commercial power supply is connected, and the memory enable signal $M_e$ is produced after the second DC power source circuit has been actuated. The memory enable signal $M_e$ is made to vanish when the magnitude of signal $E_c$ drops below the reference potential $V_m$ at the time that the commercial power supply is disconnected, the second DC power source circuit being rendered non-operational following a prescribed time delay.

17 Claims, 6 Drawing Figures

POWER SOURCE DEVICE FOR BUBBLE MEMORY UNIT

BACKGROUND OF THE INVENTION

This invention relates to a power source control device having a plurality of sources for supplying DC voltage or a plurality of signal sources, and more particularly to a power source control device which sequentially controls changes in the voltages supplied by the DC voltage or signal sources when a commercial power supply for powering the system is turned on or off.

Bubble memory units have recently been used in data memory devices for numerical control units and the like because they are cheap and, more importantly, because they are non-volatile and thus permit the stored data to be preserved even if commercial power is lost. Bubble memory units generally include a bubble memory element, a control unit for controlling such operations as the writing and reading of information with respect to the bubble memory element, and a stabilized DC power source for supplying the power to the bubble memory element and the control unit. The bubble memory element is generally of the type that is actuated by a magnetic field and includes, therefore, coil drive circuitry and associated control circuitry. The control unit includes a sense amplifier, read/write control circuitry and various other circuitry, and is adapted to write into the bubble memory element data which is sent from an external unit such as a numerical control device, or to read out the stored content of the bubble memory element and deliver this data to the external unit.

The stabilized DC power source device produces a memory enable signal $M_e$, a first DC voltage $E_c$ which is supplied to the bubble memory element and to the control circuitry in the control unit, and a second DC voltage $E_d$ which is supplied to the coil drive circuitry of the bubble memory element. When the respective levels of the first and second DC voltages $E_c$, $E_d$ are higher than specified levels, and when the level of the enable signal $M_e$ also is higher than a specified level (i.e., at logic level 1), the data obtained from the external unit can be written in the bubble memory element, or data stored in the element can be read out and sent to the external unit. Furthermore, the control unit is operable to deliver a read/write instruction to the bubble memory element when the level of the memory enable signal $M_e$ is higher than a specified level. However, neither the reading nor writing of data is possible if either of the first or second DC voltages $E_c$, $E_d$ is at a level below the specified level, even if the level of the memory enable signal $M_e$ is higher than the specified level, that is, even if the signal $M_e$ is a logic 1.

On the other hand, after the control unit has delivered a read/write instruction, even though the level of the signal $M_e$ goes below the specified level, if the respective levels of the first and second DC voltages $E_c$, $E_d$ are higher than the specified levels, the control unit can write into the bubble memory element data being temporarily stored in the control unit.

Data can be read-out from certain bubble memory elements by destructive reading, in which the stored data is destroyed as it is read out. This is followed by a refreshing operation in which the data which has been read out is written back into the bubble memory, thereby allowing the data to be preserved. The writing of data is carried out by replacing the content at a prescribed address with all zeros (an erase cycle), and then by writing the desired data into the location identified by the address (a write cycle). Accordingly, in the destructive reading of data from the bubble memory, a serious situation can occur in which the stored data is lost if the first and second DC voltages $E_c$, $E_d$ drop below the prescribed levels after the data has been read out, but before it has been refreshed. Such a situation can arise if there is a power failure or if the commercial power supply is interrupted accidentally. The loss of data in this manner is a frequent occurrence since a considerable amount of time is required between the completion of the destructive reading step and the completion of the refreshing step. A similar danger arises in the writing of the data as well. In other words, the stored data can be lost if the first and second DC voltages $E_c$, $E_d$ drop below the prescribed levels before the data is written into the bubble memory after the content at the prescribed address has been replaced by zeros. Again, this can be caused by a power failure or interruption of the commercial power supply, and the possibilities of such an event are high because of the considerable amount of time which elapses between the erase cycle and the completion of the write cycle.

Accordingly, if commercial power is lost because of carelessness or because of a power failure, it is required that the enable signal $M_e$ be lowered to a prescribed level a predetermined period of time after the loss of commercial power, but that the first and second DC voltages $E_c$, $E_d$ be maintained above specified values for a certain period of time. This is necessary to prevent the destruction of the stored data in the event that the commercial power is lost. In other words, if power is lost, the signals $M_e$, $E_c$ and $E_d$ must follow a certain sequence in dropping below specified levels, in order to preserve the stored data. The sequence begins with the enable signal $M_e$. Next, the second DC voltage $E_d$ must fall after a predetermined period of time, which must be longer than that required for a refresh or write cycle. Finally, the first DC voltage $E_c$ must fall. Moreover, when the commercial power is restored, data sent from the external unit can be stored in the bubble memory element in a reliable manner if the signals $M_e$, $E_c$ and $E_d$ rise above their respective specified levels in the order $E_c$, $E_d$, $M_e$ as they undergo the transition in the positive direction.

In a conventional apparatus the first DC voltage $E_c$ is maintained at a level above a prescribed value for an extended period of time by means of a battery when the commercial power is lost, and the enable signal $M_e$ and second DC voltage $E_d$ are caused to fall below their respective specified levels in succession during this period of time. Another conventional arrangement includes a sensor which senses a fluctuation in the voltage delivered by the commercial supply. As soon as an abnormality is detected in the commercial supply the memory enable signal is sent to a low level and the driving power sources are turned off. However, the first method is disadvantageous since the battery is large and fairly expensive. The second method is defective if employed where there are violent fluctuations in voltage, such as occur in a machine shop. This is because the sensor is actuated even by small drops in power source voltage and responds by turning off the power source device for the bubble memory unit. This results in the shut-down of equipment such as machine tools that rely upon the bubble memory unit, and a decline in the efficiency of machine tools controlled by a numerical control device.

BRIEF SUMMARY OF THE INVENTION

It is an object of the present invention to provide a novel power source device for a bubble memory unit in which a first DC voltage $E_c$ for control circuitry, a second DC voltage $E_d$ for coil drive circuitry, and an enable signal $M_e$, are made to rise to their respective specified high levels, in the order mentioned, after power from a commercial AC power supply is introduced, but which are made to fall to their respective specified low levels in the reverse order, namely in the order $M_e$, $E_d$, $E_c$, when the commercial power supply is cut off.

it is another object of the present invention to provide an inexpensive power source device, for a bubble memory unit, which does not require a back-up element such as a battery.

It is a further object of the present invention to provide a power source device for a bubble memory unit capable of being employed in locations which experience violent fluctuations in voltage, namely a power source device capable of supplying DC voltage in a reliable manner despite some degree of fluctuation in the commercial power supply.

Other features and advantages of the invention will be apparent from the following description taken in connection with the accompanying drawings.

DETAILED DESCRIPTION OF THE PREFERRED EMBODIMENT

Figure 1:
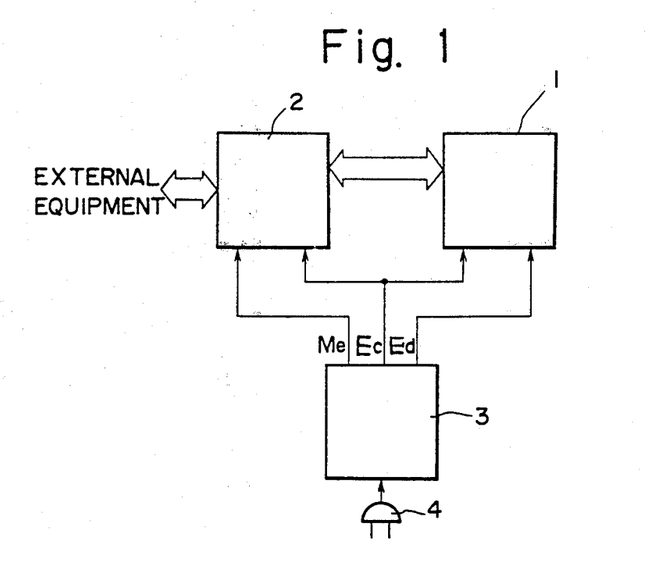
FIG. 1 is a block diagram of a bubble memory unit which includes a power source device.

Referring to FIG. 1, a bubble memory unit which includes a power source device comprises a bubble memory element 1 of the type that is actuated by a magnetic field, a control unit 2 for controlling such operations as the writing and reading of information with respect to the bubble memory element 1, a stabilized DC power source 3 which supplies the power for the memory element and control unit, and a connector 4 which provides a connection to a commercial power supply. The bubble memory element 1 includes such components as coil drive circuitry and associated control circuitry. The control unit 2 includes such components as a sense amplifier, gate circuitry, read/write control circuitry and gate signal generating circuitry, and is adapted to write into the bubble memory element 1 data which is sent from an external unit such as a numerical control device, or to read out the stored content of the bubble memory element and deliver this data to the external unit. The stabilized DC power source 3 delivers three outputs, namely a memory enable signal $M_e$ which is supplied to the control unit 2, a first DC voltage $E_c$ which is supplied to the bubble memory element 1 and the control circuitry of the control unit 2, and a second DC voltage $E_d$ which is supplied to the coil drive circuitry of the bubble memory element 1. The control unit 2 is operable to deliver a read/write instruction to the bubble memory element 1 when the level of the memory enable signal $M_e$ is higher than a specified level, that is, when $M_e$ is at logic 1.

Figure 2:
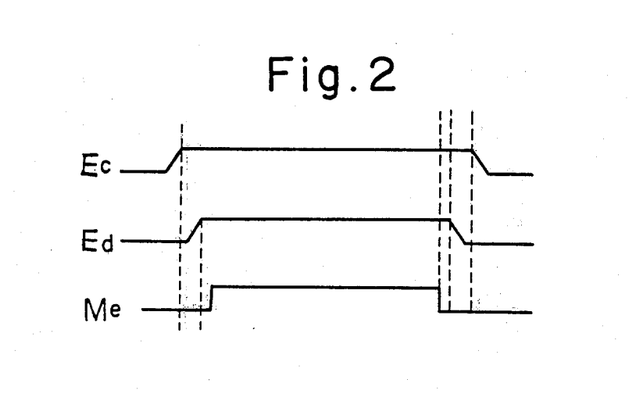
FIG. 2 is a simplified waveform diagram illustrating the desired sequence of the positive and negative transitions of a memory enable signal and DC voltages when a commercial power supply is connected and then disconnected.

The waveforms shown in FIG. 2 illustrate the sequence of the positive and negative transitions of the signals $M_e$, $E_c$, $E_d$. If the commercial power supply is interrupted, measures must be taken to prevent the destruction of the data stored in the bubble memory element 1. The stabilized DC power source 3 accomplishes this, as shown in FIG. 2, by lowering first the level of the memory enable signal $M_e$ to a lower than specified level, that is, to logic 0, a prescribed period of time after the interruption of the commercial power supply, then the level of the second DC voltage $E_d$ to a lower than specified level after the lapse of a prescribed period of time, and finally the level of the first DC voltage $E_c$ to a lower than specified level a short time later. When the power from the commercial power supply is introduced, data from an external unit can be stored reliably in the bubble memory element 1 if the signals $E_c$, $E_d$, $M_e$ are made to rise from the low to the high level in the order mentioned.

Figure 3:
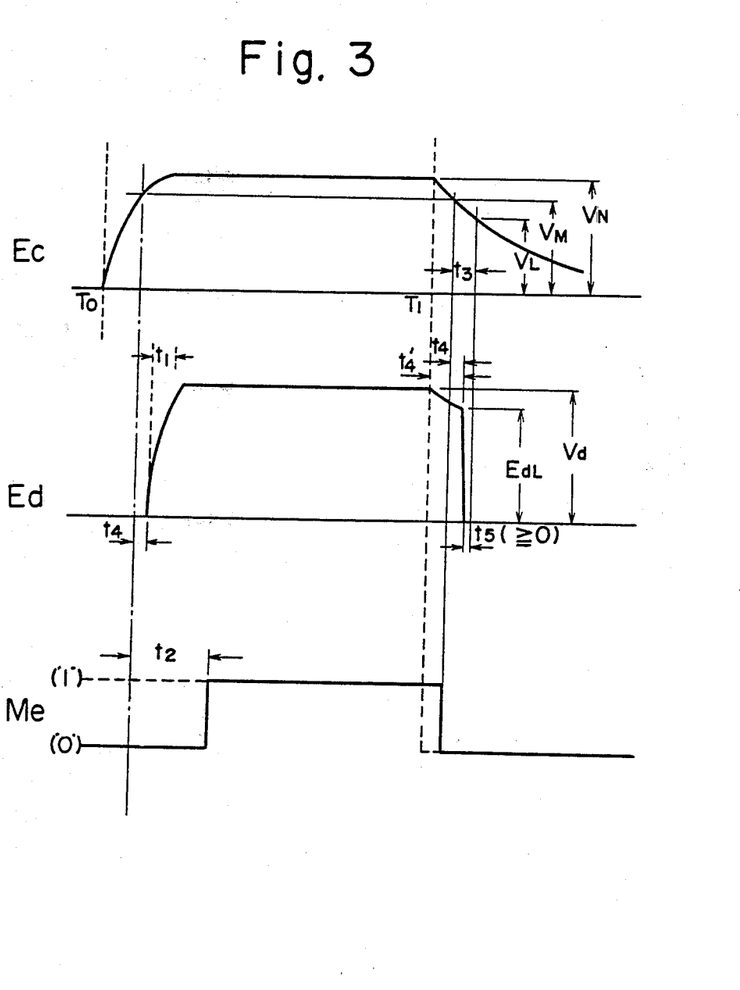
FIG. 3 is a more detailed waveform diagram illustrating the desired sequence of the positive and negative transitions of a memory enable signal and DC voltages when a commercial power supply is connected and then disconnected.

The sequence of the positive and negative transitions of the signals $M_e$, $E_c$, $E_d$ when the power supply is turned on and off can be understood more clearly from the waveforms shown in FIG. 3. Of particular importance with regard to the stabilized power source 3 that supplies power to the bubble memory element 1 is the sequence that begins when the commercial power supply is turned off. Specifically, it is critical that two time intervals be accurately maintained. These are a time interval $t_4$ which begins when the signal $M_e$ goes to logic 0 and which ends when the second DC voltage $E_d$ is about to fall, and a time interval $t_5$ which begins when the second DC voltage $E_d$ has fallen to zero and which ends when the first DC voltage $E_c$ reaches an allowable lower limit voltage $V_L$.

In general, the time intervals $t_4$, $t_5$ have the following specifications:

$t_4 \geq$ tens of microseconds $t_5 \geq 0$, these depending upon the processing time of the bubble memory element 1.

If the set voltage of the first DC voltage $E_c$ is $V_N$, and the voltage intermediate this and the allowable lower limit voltage $V_L$ is $V_M$, a time $t_3$, which is required for the first DC voltage $E_c$ to fall from the point $V_M$ to the point $V_L$ when the commercial power supply is interrupted, is decided by the characteristic of the stabilized DC power source which supplies the first DC voltage $E_c$, and by the load which is connected thereto. In ordinary stabilized DC power sources the magnitude of the time interval $t_3$ is between 1 and 2 milliseconds.

Figure 4:
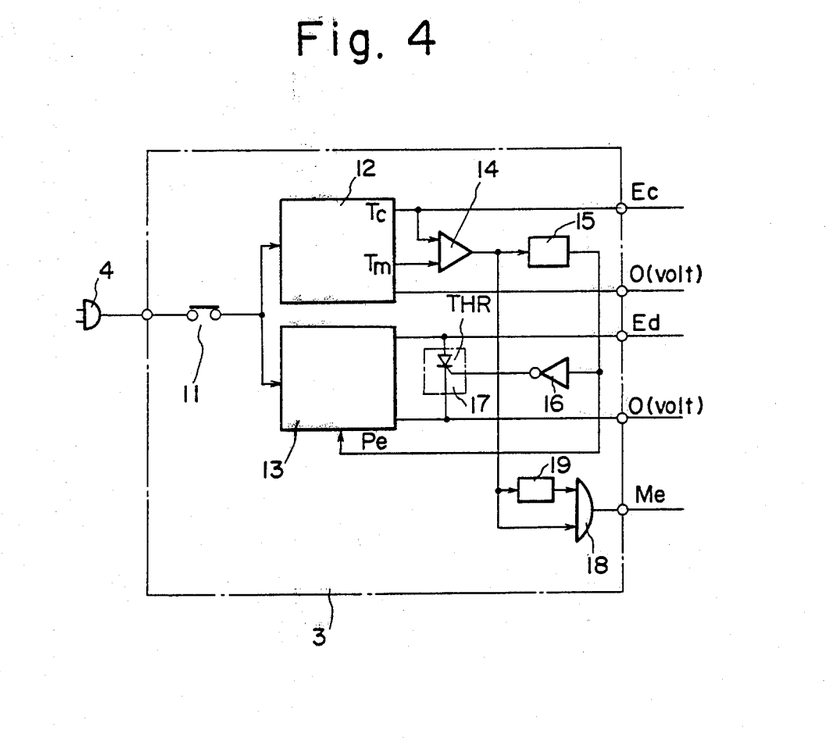
FIG. 4 is a block diagram of a stabilized DC power source device in accordance with the present invention.

Shown in FIG. 4 is a block diagram of the stabilized DC power source device 3 in accordance with the present invention. In this case the device provides a time interval $t_4$ which is equal to or greater than tens of microseconds. The device includes a power source switch 11, a stabilized DC power source circuit 12 for supplying the first DC voltage $E_c$, a stabilized DC power source circuit 13 for supplying the second DC voltage $E_d$, a comparator 14, a delay circuit 15 for setting a delay time which corresponds to the time interval $t_4$ shown in FIG. 3, a NOT gate 16, a rapid discharge circuit 17 comprising an ordinary thyristor THR, an AND gate 18, and a delay circuit 19 for establishing a delay time which corresponds to the time interval $t_2$ shown in FIG. 3.

Figure 5:
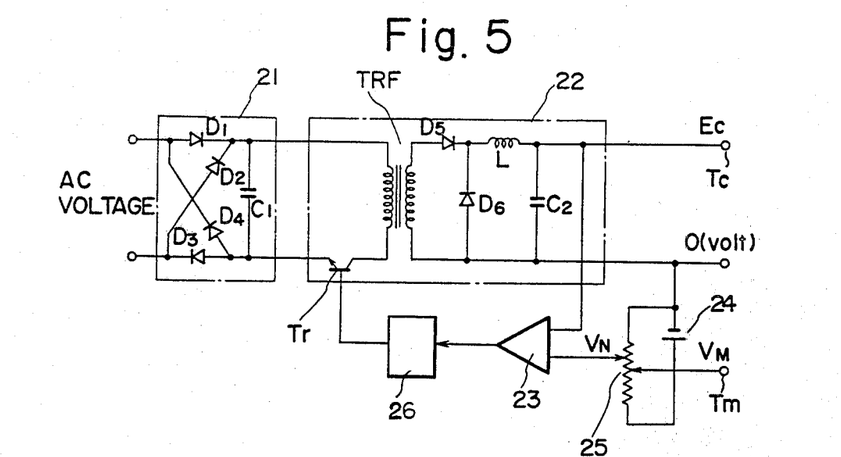
FIG. 5 is a block diagram of the stabilized DC power source circuit 12 in FIG. 4 for supplying the first DC voltage $E_c$.

The stabilized DC power source circuit 12 has the construction shown in FIG. 5. The arrangement includes a rectifier circuit 21 comprising full-wave rectifier comprising four diodes $D_1$ through $D_4$, and a smoothing capacitor $C_1$. The rectifier circuit 21 is connected to a power control circuit 22 comprising a power transistor $T_r$, a transformer TRF, and a smoothing capacitor $C_2$, an inductor L, and diodes $D_5$, $D_6$ which make up a single-phase rectifier. The power transistor Tr, in a manner which will be described later, is controlled to change the pulse width of the voltage signal impressed on the primary winding of the transformer TRF in accordance with the magnitude of the output voltage $E_c$.

More specifically, the power control circuit 22 operates in such a manner as to render the output voltage $E_c$ equivalent to the set voltage $V_N$ by modulating the pulse width of the voltage signal impressed on the transformer TRF. A differential amplifier 23 amplifies the difference between the output voltage $E_c$ and the set voltage $V_N$. A pulse width modulator 26 having an input terminal connected to the differential amplifier 23 and having an output connected to the base of the power transistor $T_r$, modulates the voltage signal impressed on the transformer TRF by making the power transistor turn on periodically and turn off in accordance with the magnitude of the difference. Numeral 24 denotes a reference voltage source, and 25$a$ rheostat or potentiometer for adjusting the set level, the output of the rheostat 25 being the set voltage $V_N$ as well as the intermediate voltage $V_M$ illustrated in FIG. 3.

The rectifier circuit 21 in the stabilized DC power source circuit 12 serves to convert alternating current into direct current. The resulting DC voltage is applied to the power control circuit 22 which is adapted to render the output voltage $E_c$ equivalent to the set value $V_N$. In other words, power transistor $T_r$ turns on periodically. If the output voltage $E_c$ exceeds the set value $V_N$, the differential amplifier 23 detects this and sends a signal to the pulse width modulator 26, this time to turn the power transistor off and lower the output voltage. Thus, the output voltage $E_c$ is controlled at all times so as to be equal to the set voltage value $V_N$ determined by the rheostat 25. The reference voltage $V_M$ is present at the terminal $T_m$ at all times.

Figure 6:
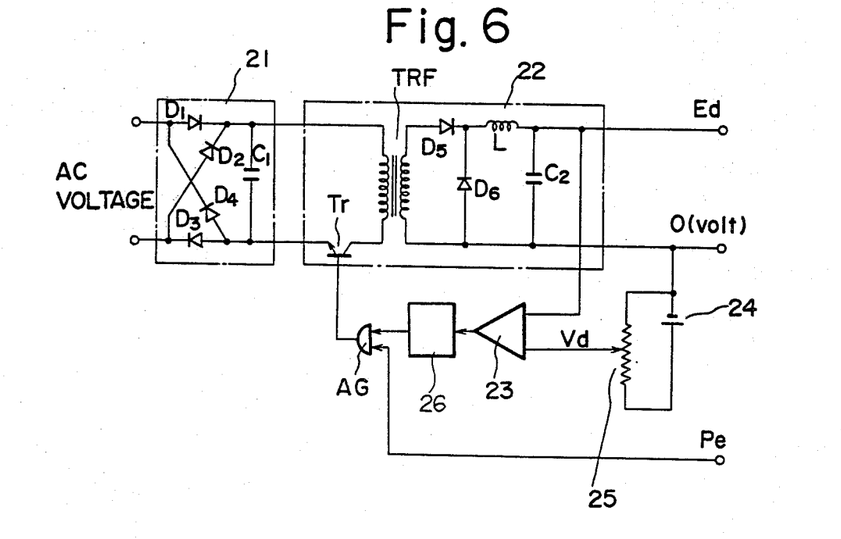
FIG. 6 is a block diagram of the stabilized DC power source circuit 13 in FIG. 4 for supplying the second DC voltage $E_d$.

FIG. 6 shows the construction of the stabilized DC power source circuit 13. The arrangement of FIG. 6 is almost identical to that of FIG. 5, and like or corresponding component parts bear the same reference numeral and characters. A description of these component parts has already been provided. The stabilized DC power source circuit 13 differs from that of FIG. 5 in that (a) there is no reference voltage $V_M$; (b) a power enable signal $P_e$ is received as an input signal; (c) an AND gate AG is provided, the AND gate being opened by the power enable signal $P_e$; and (d) a reference voltage $V_d$ is produced in cooperation with the rheostat 25. When the power enable signal $P_e$ is a logic 0, the power transistor is in the off state, and $E_d$ is at zero volts. When the power enable signal $P_e$ goes to logic 1, however, the output voltage $E_d$ is caused to approach the set voltage $V_d$, and is stabilized at that value, in the same manner as described in connection with FIG. 5.

Reference will again be had to FIGS. 3 and 4 to describe the overall operation of the stabilized power source device of the present invention.

Closing power source switch 11 at time $T_o$ applies AC voltage to the stabilized DC power source circuit 12 which supplies the first DC voltage $E_c$, and to the stabilized DC power source 13 which supplies the second DC voltage $E_d$. Since the power enable signal $P_e$ initially is at logic 0, the output voltage $E_d$ delivered by the stabilized DC power source circuit 13 at this time is zero. Stabilized DC power source circuit 12 rectifies the applied AC voltage, as described in connection with FIG. 5, and provides the output voltage $E_c$ at its terminal $T_c$, the output voltage rising gradually with the passage of time. Meanwhile the reference voltage $V_M$ is constantly being provided at the terminal $T_m$ owing to the reference voltage source 24, shown in FIG. 5, which is included in power source circuit 12 in order to set the voltage $V_M$ intermediate the allowable lower limit voltage $V_L$ and the set voltage $V_N$. The comparator 14 compares the magnitudes of the output voltage $E_c$ and the reference voltage $V_M$. Since $E_c$ is initially less than $V_M$ ($E_c < V_M$), the output of the comparator will, initially, represent logical 0. Hence, the power enable signal $P_e$ is at logic 0 as described above, and the $E_d$ output of stabilized DC power source circuit 13 is zero volts. As the output voltage $E_c$ gradually rises and surpasses the reference voltage $V_M$, as shown in FIG. 3, the output of comparator 14 goes to logic 1. Then, after a time delay $t_4$ determined by the delay circuit 15, the logic 1 emerges as the power enable signal $P_e$ which turns off the thyristor THR in the rapid discharge circuit 17 so that capacitor $C_2$, shown in FIG. 6, is no longer short-circuited. The power transistor $T_r$ in the stabilized DC power source circuit 13 is turned on or rendered conductive as the enable signal goes to logic 1, with the result that the second DC output voltage $E_d$ is delivered by power source circuit 13. The value of output voltage $E_d$ gradually rises and then surpasses the value of an allowable voltage $Ed_L$ after a time interval $t_1$ which begins when the output of comparator 14 goes to logic 1. Finally, the output of AND gate 18 goes to logic 1 after a time interval $t_2$ which also begins when the output of comparator 14 goes to logic 1, this time delay being provided by the delay circuit 19. Thus, the signals $E_c$, $E_d$, $M_e$ undergo a positive transition in the order mentioned.

Next, if power source switch 11 is opened at time $T_1$, or if there is a power failure or an accident which disconnects the AC cord from the commercial power supply at this time, the supply of AC voltage to the stabilized DC power source circuits 12, 13 will be interrupted, and the output voltages $E_c$, $E_d$ delivered thereby will begin to drop in a gradual manner. The output of comparator 14 will go to logic 0 as the voltage $E_c$ at terminal $T_c$ drops below the reference voltage $V_M$, namely the intermediate level $V_M$, AND gate 18 will close, and the memory enable signal $M_e$ will immediately go to logic 0. Power enable signal $P_e$ then goes to logic 0 after the lapse of a period of time $t_4$ with the result that the power transistor $T_r$ in the stabilized DC power source circuit 13 is turned off, thereby deactivating the circuit. At the same time, the power enable signal $P_e$ which is logic 0 turns on the thyristor THR in the rapid discharge circuit 17, thereby creating a short circuit across the output terminals of the power source circuit 13 so that the second DC voltage $E_d$ is rapidly set to zero, this arising from the fact that the charge stored in capacitor $C_2$ is allowed to discharge. Meanwhile, the first DC voltage $E_c$ delivered by stabilized DC power source circuit 12, and which has been dropping since the loss of commercial power, continues to decline gradually. This voltage will drop below the allowable lower limit $V_L$ after the lapse of time $t_5$.

Thus, the present invention, as described and illustrated above, includes a rapid discharge circuit provided between the output terminals of the power source that supplies the DC voltage for drive circuitry, and is constructed in such a manner that the rapid discharge circuit is actuated after a prescribed time delay that begins when the memory enable signal is interrupted. This assures a sequence wherein the power source for the drive circuitry will be cut off after the interruption of the memory enable signal. Moreover, the device of the present invention has a simple construction since it can be realized by adding ordinary component parts to the conventional arrangement.

As many apparently widely different embodiments of the present invention can be made without departing from the spirit and scope thereof, it is to be understood that the invention is not limited to the specific embodiments thereof except as defined in the appended claims.

What we claim is:

1. A power source device for a bubble memory unit having a control circuit, a drive circuit, and a bubble memory element, said power source device for supplying a first DC voltage signal $E_c$ which is applied to the control circuit for controlling the reading and writing of data, a second DC voltage signal $E_d$ which is applied to the drive circuit for driving the bubble memory element, and a memory enable signal $M_e$ which enables data to be written in the bubble memory element or read out therefrom, the signals $E_c$, $E_d$ and $M_e$ being made to rise and fall according to a prescribed sequence as a commercial power supply is connected and disconnected, said power source device comprising:
    a first DC power source circuit, coupled to the commercial power supply, for generating a reference level voltage $V_M$ and said first DC voltage signal $E_c$;
    a second DC power source circuit, coupled to the commercial power supply, for generating said second DC voltage signal $E_d$;
    a comparator circuit for comparing the magnitude of said first DC voltage signal $E_c$ with said reference level voltage $V_M$ and for generating a comparison signal;
    signal generating means, coupled to said comparator circuit, for generating the memory enable signal $M_e$; and
    delay means for delaying said comparison signal and for providing a power enable signal $P_e$, corresponding to the delayed comparison signal, to said second DC power source circuit; wherein when the commercial power supply has been connected, and after the lapse of time until the comparison signal indicates that the magnitude of said first DC voltage signal $E_c$ surpasses the reference level voltage $V_M$, said delay means generating said power enable signal $P_e$, said power enable signal $P_e$ actuating said second DC power source circuit so that said second DC voltage signal $E_d$ is generated and thereafter said signal generating means generates the memory enable signal $M_e$.

2. The power source device as set forth in claim 1, further comprising a rapid discharge circuit connected across the output terminals of said second DC power source circuit and connected to said delay means, said rapid discharge circuit operational until the power enable signal $P_e$ is generated by said delay means, said rapid discharge circuit rendered non-operational by the generation of the power enable signal $P_e$.

3. The power source device as set forth in claim 1 or 2, wherein the reference level voltage $V_M$ is less than a set value $V_N$ of the first DC voltage $E_c$ and greater than an allowable lower limit voltage $V_L$.

4. The power source device as set forth in claim 1 or 2, wherein the commercial power supply generates an AC input voltage and wherein said second DC power source circuit comprises:
    means for generating a reference voltage;
    a first rectifier circuit for rectifying the AC input voltage;
    a power transistor, connected to said first rectifier circuit, for generating a voltage signal having a rectangular waveform;
    a pulse width modulator, operatively connected to the base of said power transistor, for generating a modulating signal to turn the power transistor on and off;
    a second rectifier circuit, operatively connected to said power transistor, for rectifying the voltage signal which has been pulse-width modulated by said pulse width modulator and for providing, as an output, said second DC voltage signal $E_d$;
    a comparator circuit, operatively connected to said second rectifier circuit, for comparing the magnitudes of said second DC voltage signal $E_d$ and the reference voltage and for actuating said pulse width modulator in dependence upon the result of the comparison; and
    a gate circuit, connected between said power transistor and said pulse width modulator and connected to said delay means, for gating the output of said pulse width modulator so as to turn said power transistor on and off;
    said gate circuit responding to the generation of the power enable signal $P_e$ to pass the output of the pulse width modulator, whereby said power transistor is turned on or off in accordance with the output of the pulse width modulator to control the output of the DC voltage signal $E_d$ from said second rectifier.

5. A power source device for a bubble memory unit having a control circuit for controlling the reading and writing of data, a bubble element, and a drive circuit for driving the bubble element, said power source device for supplying a first DC voltage signal $E_c$ to the control circuit, a second DC voltage signal $E_d$ to the drive circuit for driving the bubble memory element, and a memory enable signal $M_e$ for enabling data to be written in or read out of the bubble memory element, said signals $E_c$, $E_d$ and $M_e$ being made to rise and fall according to a prescribed sequence as a commercial power supply is connected and disconnected, said power source device comprising:
- a first DC power source circuit, coupled to the commercial power supply, for generating a reference voltage $V_M$ and said first DC voltage signal $E_c$;
- a second DC power source circuit, coupled to the commercial power supply, for generating said second DC voltage signal $E_d$;
- a comparator circuit for comparing the magnitude of said first DC voltage signal $E_c$ with said reference level voltage $V_M$ and for generating a comparison signal; and
- delay means for delaying said comparison signal and for providing a power enable signal $P_e$, corresponding to the delayed comparison signal, to said second DC power source circuit;
- the memory enable signal $M_e$ ceasing immediately when the value of the first DC voltage signal $E_c$ drops below the reference voltage $V_m$ at the time that the commercial power supply is disconnected;
- said second DC power source circuit rendered nonoperative a prescribed period of time, determined by said delay means, after the memory enable signal $M_e$ ceases.

6. The power source device as set forth in claim 5, further comprising a rapid discharge circuit connected across the output terminals of said second DC power source circuit and operatively connected to said delay means, said rapid discharge circuit rendered operational after said prescribed period of time.

7. The power source device as set forth in claim 5 or 6, wherein the commercial power supply generates an AC input voltage and wherein said second DC power source circuit comprises:
- means for generating a reference voltage;
- a first rectifier circuit for rectifying the AC input voltage;
- a power transistor, connected to said first rectifier circuit, for generating a voltage signal having a rectangular waveform;
- a pulse width modulator circuit, operatively connected to the base of said power transistor, for modulating said voltage signal by turning the power transistor on and off;
- a second rectifier circuit, operatively connected to said power transistor, for rectifying the voltage signal which has been pulse-width modulated by said pulse width modulator and for providing, as an output, said second DC voltage signal $E_d$;
- a comparator circuit, operatively connected to said second rectifier circuit and to the means for generating a reference voltage, for comparing the magnitudes of the second DC voltage signal $E_d$ and the reference voltage and for actuating said pulse width modulator in dependence upon the result of the comparison; and
- a gate circuit, connected between said power transistor and said pulse width modulator and connected to said delay means, for gating the output of said pulse width modulator so as to turn said power transistor on and off;
- said gate circuit closed after said prescribed period of time to block the output of said pulse width modulator, whereby said power transistor is turned off.

8. The power source device as set forth in claim 5 or 6, wherein the reference level voltage $V_M$ is less than a set value $V_N$ of the first DC voltage $E_c$ and greater than an allowable lower limit voltage $V_L$.

9. A power source device for a bubble memory unit having a bubble memory element, a control circuit for controlling the reading and writing of information with respect to the bubble memory element and a drive circuit for driving the bubble memory element, said power source device connected to a commercial power supply, said power source device comprising:
- a first DC power source circuit, coupled to the commercial power supply, for generating a first reference voltage signal and a first DC voltage signal, said first DC voltage signal provided to the control circuit of the bubble memory unit;
- a second DC power source circuit, coupled to the commercial power supply, for generating a second DC voltage signal provided to the drive circuit of the bubble memory unit;
- comparator means, operatively connected to said first DC power source circuit, for comparing said first reference voltage signal and said first DC voltage signal, and for providing, as an output, a comparison signal;
- signal generating means, operatively connected to said comparator means, for receiving said comparison signal and for providing a memory enable signal to the control circuit in dependence upon said comparison signal;
- delay means, operatively connected between said comparator means and said second DC power source circuit, for delaying said comparison signal and for generating a power enable signal corresponding to the delayed comparison signal;
- wherein, at a time after the commercial power supply is connected said comparison signal indicates that said first DC voltage signal is greater than said first reference voltage signal whereupon said delay means will generate said power enable signal which will actuate said second DC power source circuit so that said second DC voltage signal is generated, said signal generating means generating said memory enable signal after said second DC voltage signal has been generated.

10. A power source device as set forth in claim 9, further comprising a rapid discharge circuit, connected across the output terminals of said second DC power source circuit and operatively connected to said delay means, for short circuiting the output of said DC power source circuit until said power enable signal indicates that said first DC voltage signal is greater than said first reference voltage signal at which time said rapid discharge circuit is rendered non-operational.

11. A power source device as set forth in claim 10, wherein said rapid discharge circuit comprises a thyristor having first and second terminals connected to the output terminals of said second DC power source circuit and having a gate operatively connected to the output of said delay means.

12. A power source device as set forth in claim 9 or 10, wherein said first DC voltage signal has a maximum set value which is greater than said first reference voltage signal and wherein said first DC voltage signal has a lower limit value which is less than said first DC voltage signal.

13. A power source device as set forth in claim 9 or 10, wherein the commercial power supply generates an AC input voltage and wherein said second DC power source circuit comprises:
- a first rectifier circuit for rectifying the AC input voltage;

means for providing a second reference voltage;

first differential amplifier means for comparing said second reference voltage signal to said second DC voltage signal and for generating a first difference signal;

first pulse width modulator means for providing, as an output, a first modulation signal in dependence upon said first difference signal;

an AND gate having a first input connected to the output of said first pulse width modulator means and having a second input connected to the output of said delay means, said AND gate for providing, as an output, said first modulation signal in dependence upon said power enable signal; and power control circuit means, operatively connected to said first rectifier circuit, said differential amplifier means and said AND gate, for generating said second DC voltage signal in dependence upon said first modulation signal provided at the output of said AND gate.

14. A power source device as set forth in claim 13, wherein said power control circuit means comprises:

a first power transistor, having a base connected to the output of said AND gate, having an emitter connected to said first rectifier circuit and having a collector;

a first transformer, connected to said first rectifier circuit and to the collector of said first power transistor; and a second rectifier circuit connected to said first transformer, said second rectifier circuit providing, as an output, said second DC voltage signal, whereby said first power transistor is turned on or off in accordance with the output of said AND gate to control said second DC voltage signal.

15. A power source device as set forth in claim 14, wherein said first DC power source circuit comprises:

a third rectifier circuit for rectifying the AC input voltage;

means for generating a third reference voltage signal;

second differential amplifier means for comparing said first DC voltage signal and said third reference voltage signal and for generating a second difference signal;

second pulse width modulator means for generating a second modulation signal in dependence upon said second difference signal;

a second power transistor, having a base connected to the output of said second pulse width modulator means, having an emitter connected to said third rectifier circuit and having a collector;

a second transformer connected to the collector of said second power transistor and to said third rectifier circuit; and a fourth rectifier circuit connected to said second transformer, for generating said first DC voltage signal, whereby said second power transistor is turned on or off in accordance with the output of said second pulse width modulator means to control said first DC voltage signal.

16. A power source device as set forth in claim 15, wherein said signal generating means comprises:

second delay means connected to the output of said comparator means, for generating a delayed enable comparison signal; and a second AND gate, having a first input connected to the output of said second delay means and having a second input connected to the output of said comparator means, for generating said memory enable signal when both said comparison signal and said delayed enable comparison signal are present.

17. A power source device for a bubble memory unit, said power source device connected to a commercial power supply, said power source device comprising:

a first DC power source circuit, coupled to the commercial power supply, for generating a first reference voltage signal and a first DC voltage signal, said first DC voltage signal provided to the bubble memory unit;

a second DC power source circuit, coupled to the commercial power supply, for generating a second DC voltage signal provided to the bubble memory unit;

comparator means, operatively connected to said first DC power source circuit, for comparing said first reference voltage signal and said first DC voltage signal, and for providing, as an output, a comparison signal;

signal generating means, operatively connected to said comparator means, for receiving said comparison signal and for providing a memory enable signal to the bubble memory unit in dependence upon said comparison signal;

delay means, operatively connected between said comparator means and said second DC power source circuit, for delaying said comparison signal and for generating a power enable signal corresponding to said delayed comparison signal;

wherein, at a time after the commercial power supply is connected, said comparison signal indicates that said first DC first voltage signal is greater than said first reference voltage signal whereupon said delay means will generate said power enable signal which will actuate said second DC power source circuit so that said second DC voltage signal is generated, said signal generating means generating said memory enable signal after said second DC voltage signal has been generated.

* * * * *

UNITED STATES PATENT AND TRADEMARK OFFICE
CERTIFICATE OF CORRECTION

PATENT NO. : 4,327,422
DATED : APRIL 27, 1982
INVENTOR(S) : RYOJI IMAZEKI ET AL.

It is certified that error appears in the above—identified patent and that said Letters Patent is hereby corrected as shown below:

Front page, [54], after "FOR" insert --A--.

Column 1, line 1, after "FOR" insert --A--.

Column 3, line 16, "it" should be --It--.

Signed and Sealed this

Tenth Day of August 1982

[SEAL]

*Attest:*

GERALD J. MOSSINGHOFF

*Attesting Officer* *Commissioner of Patents and Trademarks*